United States Patent [19]

Nicolas

[11] 3,981,076
[45] Sept. 21, 1976

[54] METHOD OF CONNECTING ELECTRONIC MICROCOMPONENTS

[75] Inventor: Gerard Nicolas, Grenoble, France

[73] Assignee: Commissariat a l'Energie Atomique, Paris, France

[22] Filed: Nov. 27, 1974

[21] Appl. No.: 527,828

[52] U.S. Cl. .................................. 29/626; 29/625; 174/68.5; 317/101 CC
[51] Int. Cl.² ........................................ H05K 3/30
[58] Field of Search .......... 174/52 S, 52 PE, DIG. 3, 174/68.5; 317/101 C, 101 CC, 101 B, 101 CM, 101 A, 101 D; 29/625, 626; 339/17 C; 156/56, 166, 436

[56] References Cited
UNITED STATES PATENTS

| | | | |
|---|---|---|---|
| 3,041,504 | 7/1962 | Lacan | 317/101 CC |
| 3,643,133 | 2/1972 | Towell | 174/68.5 X |
| 3,674,914 | 7/1972 | Burr | 174/68.5 |
| 3,701,838 | 10/1972 | Olney, Jr. | 174/68.5 |

FOREIGN PATENTS OR APPLICATIONS

| | | | |
|---|---|---|---|
| 2,185,915 | 1/1974 | France | 317/101 CC |
| 511,743 | 1/1955 | Italy | 174/68.5 |

*Primary Examiner*—James R. Duzan
*Attorney, Agent, or Firm*—Lane, Aitken, Dunner & Ziems

[57] ABSTRACT

A method of connecting electronic microcomponents comprising the steps of realizing a support with conducting wire connecting pads secured on said support, the position of which is adapted to the arrangement of the connections for the microcomponents, making a connecting circuit by sticking an insulated wire onto said support and connecting said conducting wire connecting pads, positioning the microcomponent panels so that each microcomponent connection is in electrical contact with one of said wire connecting pads, welding the connections to their respective wire connecting pads.

A substrate for connecting microcomponents comprising a support on which conducting wire connecting pads are deposited and joined by a connecting circuit made of insulated wire.

A hybrid circuit comprising a number of electronic microcomponents connected by said substrate.

8 Claims, 13 Drawing Figures

METHOD OF CONNECTING ELECTRONIC MICROCOMPONENTS

The invention relates to a method of connecting electronic micro-components, a connecting substrate obtained by the method, and a hybrid circuit comprising an aforementioned substrate. The invention is of use in micro-electronics.

It is known that research on the miniaturisation of electronic components has led to the construction of integrated circuits which take up very little space and are relatively cheap. At present, however, miniaturisation is limited to some extent, not by the components themselves but by the connecting circuits between the components. At present most micro-components, for example, integrated circuits, are disposed in individual boxes which are considerably bulkier than the circuit which they contain. This results in a disproportion between the small space occupied by the panel bearing the micro-component and the space occupied by the box, a large part of which is occupied by the output connections. When the component becomes more complex, there is a corresponding increase in the number of outputs, so that the disproportion tends to increase. In some circuits, the operating times should often be less than 1 nanosecond, so that the time taken by signals to travel in the connecting circuit may be a limiting factor when the connections between the different boxes are about 10 cm long. Finally, the price of the box alone is a considerable fraction of the price of the integrated circuit which it contains. For all these reasons, attempts have recently been made to mount the microcomponents directly on a connecting substrate which, in the prior art, is constructed in the form of multi-layer circuits.

In a sense, the multi-layer connecting substrate is a printed circuit on which the components are mounted without the conventional box. A circuit of this kind will hereinafter be called a "hybrid circuit", in that it comprises an association of micro-components on a connecting substrate. At present a distinction is made between two kinds of multi-layer circuits, depending on whether the layers are thick or thin. In both cases the method of manufacturing these circuits is complex and requires very expensive apparatus. In order to illustrate the advantages provided by the present invention, for example in the simplification of the manufacturing apparatus, we shall give a more detailed description of the method of manufacturing multi-layer circuits.

Thick layers are usually deposited on a ceramic support, using the silk-screen process. The layers are insulating or conducting and are baked at high temperatures. Bushings between a number of layers are obtained by forming windows in the insulating layers at the time when they are deposited. The structures at different levels are interconnected at the same time as the stack is formed. The thin layers are usually deposited by evaporations in vacuo, followed by etching after deposition and daylight printing of a photo-sensitive resin. In some cases, the evaporation in vacuo may be through a mask. As can be seen the multi-layer circuit method, though suitable for the manufacture of connecting substrates on a very large scale, results in apparatus which is very expensive and therefore unsuited for small-scale or even medium-scale manufacture.

One subject of the present invention, on the other hand, is a method of connecting electronic microcomponents which avoids the disadvantages of prior art methods, in that it does not require expensive apparatus but provides a connecting substrate having all the qualities required in micro-electronics, e.g., with regard to the density of connections, reliability, possibility of repair, cheapness, etc. To this end, in the method according to the invention, it is proposed to construct the connections from insulated wire, for example thermoset adhesive wire having a small cross-section, so that insulation between conductors is ensured without the complexity of the circuit being limited by technical difficulties in stacking the layers. The method according to the invention can be automated and can therefore, in view of its simplicity, be used to construct hybrid circuits on a small or medium scale.

More particularly, the invention relates to a method of connecting electronic micro-components, characterised in that a connecting circuit is made from insulated wire, which is stuck on to a support and connects the conducting wire connecting pads secured to the support, the position of which is adapted to the arrangement of the connections for the micro-components; the micro-component panels are positioned so that each micro-component connection is in contact with one of the wire connecting pads; and the connections are welded to their respective wire connecting pads.

In a first embodiment, the method is characterised in that, in order to manufacture the connecting circuit, the conducting wire connecting pads are deposited on the support at the desired positions, the connecting circuit is wired, dividing it up into partial circuits made from a continuous wire which is stuck to the support at the same time as it is unwound and which is conveyed over the wire connecting pads; the partial circuits are superposed to obtain the complete connecting circuit; the insulated wire is stripped at each wire connecting pads; the stripped parts are welded on to the corresponding wire connecting pads, and those parts of the wire which do not form part of the final connecting circuit are cut off.

In a second embodiment, the method is characterised in that, in order to construct the connecting circuit, insulating frames are made having dimensions such that each frame can receive one panel of micro-components to be connected and grooves are formed in the frame peripheries; the frames are disposed on the support; the connecting circuits are wired, dividing them up into partial circuits made from a continuous wire which is conveyed into the grooves; the partial circuits are superposed to obtain the complete connecting circuit; the wire is stripped at the places where the wire connecting pads are to be positioned; the wire connecting pads are manufactured by forming an electrolytic deposit, during which the continuous wires forming each partial circuit are raised to appropriate potentials, and those parts of the wire not forming part of the final connecting circuit are cut off.

The invention also relates to a substrate for connecting electronic micro-components obtained by the aforementioned method, characterised in that it comprises a support manufactured according to the first embodiment, on which conducting wire connecting pads are deposited and connected by a circuit made of insulated wire.

In an embodiment corresponding to the second variant of the method, the substrate comprises insulating frames having dimensions such that each frame can receive one panel of micro-components to be connected, the frames being disposed on the support; and a connecting circuit comprising portions of insulated wires stuck to the support and connected at the frames to the connecting conducting wire connecting pads.

Finally, the invention relates to a hybrid circuit comprising a number of micro-components, characterised in that the connecting substrate used in manufactured according to the method.

The invention will be more clearly understood from the following description of non-limitative, purely explanatory embodiments, with reference to the accompanying drawings, in which:

FIGS. 1a – 1c a first embodiment of the connecting substrate;

FIG. 2 is a perspective view of an insulating frame for connecting a connecting wire to the micro-component panel in the second embodiment of the connecting substrate;

FIGS. 3a and 3b diagrammatically represent the method of wiring the connecting circuit;

Figure 8:
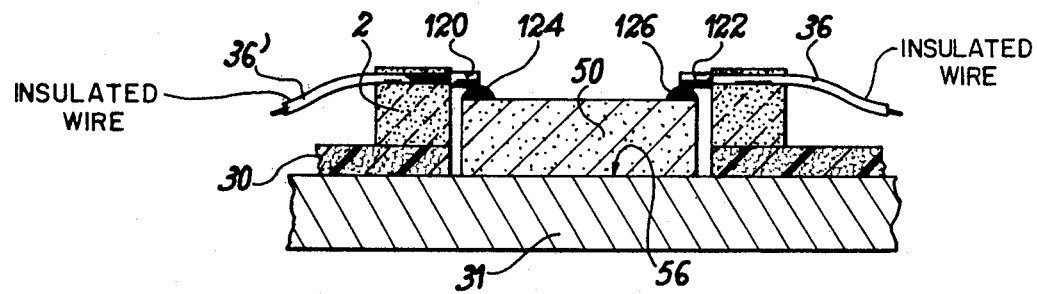
Figure 6:
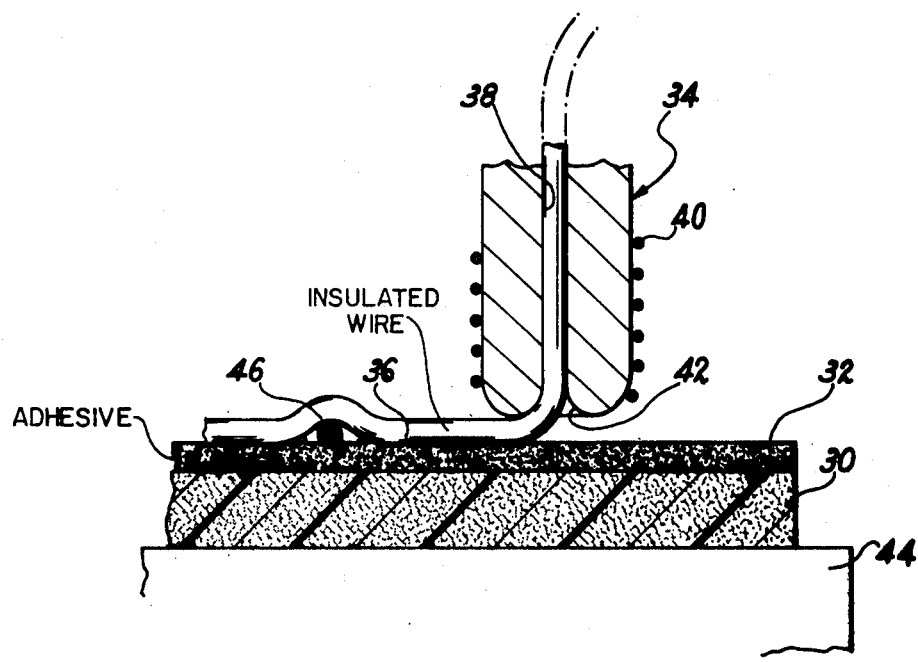
Figure 7:
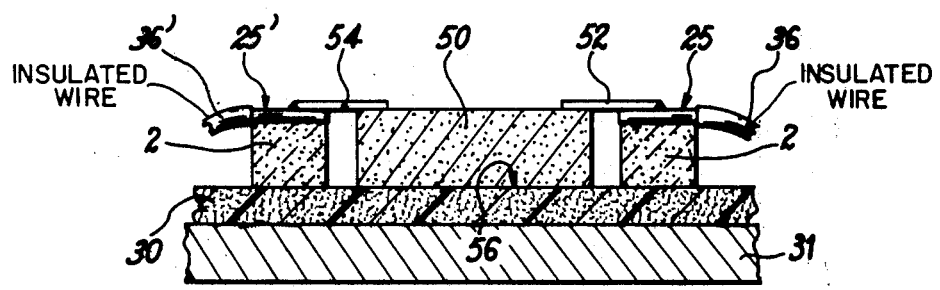

FIG. 6 diagrammatically shows the feed head for the insulated wire;

FIG. 7 is an example illustrating the method of securing a micro-component in its frame; and FIG. 8 is another example of the method of securing the micro-component.

Figure 1A:
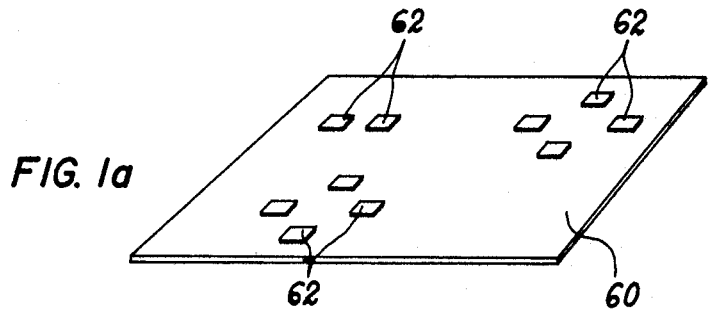
Figure 1B:
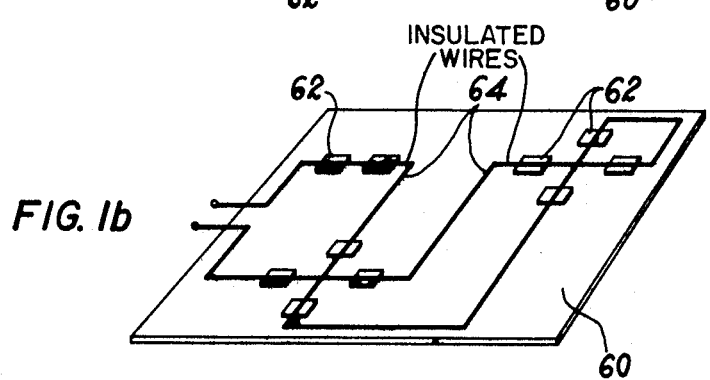
Figure 1C:
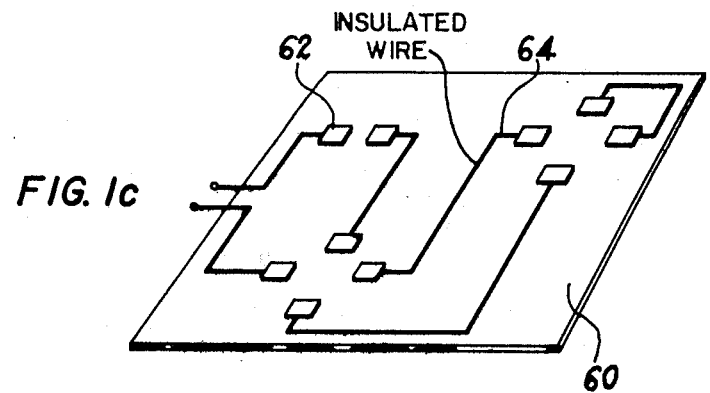

FIG. 1 shows a first embodiment of the connecting substrate according to the invention and illustrates the main steps in the production method (FIGS. 1a, 1b, 1c). In FIG. 1a, the conducting wire connecting pads 62 are deposited on a support 60 at appropriate places corresponding to the connections of the micro-components which will be in contact with the wire connecting pads. In a second step (FIG. 1b) an insulated wire 64 is unwound in order to wire the connecting circuit, which is divided into partial circuits which can be made from a single length of wire. Next, the partial circuits are superposed to form the complete circuit. The insulated wire 64 is stripped at each wire connecting pad 62 and the stripped parts are welded to the corresponding wire connecting pads; next, parts of the wire not forming part of the connecting circuit are cut off, giving the connecting substrate shown in FIG. 1c. Next, the micro-component panels are pressed against the different studs, after which it is merely necessary to weld the micro-component connections to the wire connecting pads. The various operations, which have been briefly mentioned, will now be described in greater detail with reference to the second embodiment.

Figure 2:
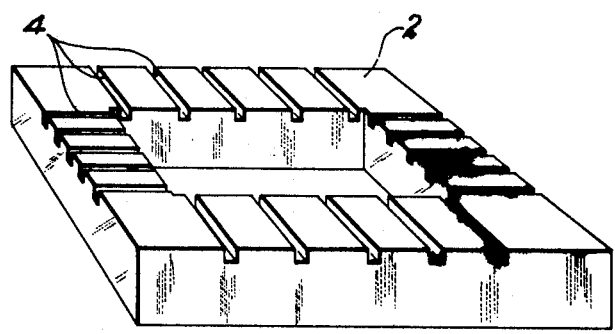

A special auxiliary component may be provided, to ensure that the connection between the insulated wire and the plate bearing the electronic micro-component is made under good conditions with regard to positioning, mechanical behaviour, flatness and possibility of repair. A component of the aforementioned kind is illustrated by way of example in FIG. 2, which is a perspective view of an insulating frame 2 for connecting the insulated wire to the micro-component panel which is being positioned in the frame. The side surfaces of the frame has been machined to form a number of grooves 4 which are either at regular intervals, or positioned in accordance with the micro-component connections used in conjunction with the frame. The frame may be made of ceramic e.g. alumina.

Figure 3A:
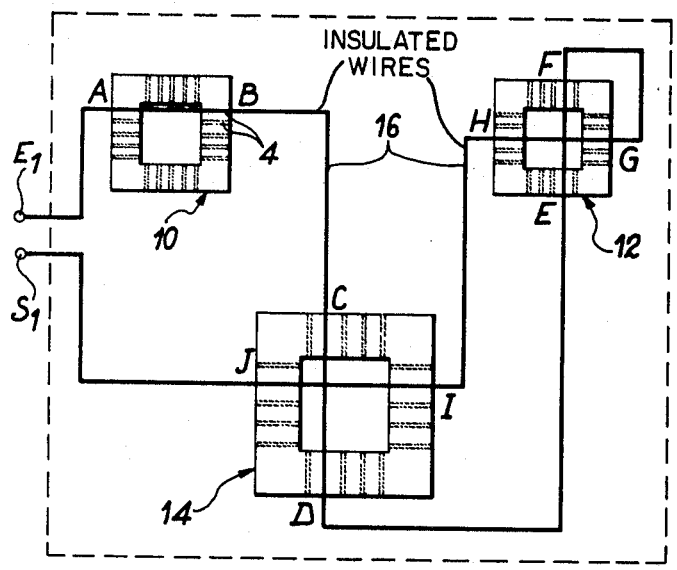
Figure 3B:
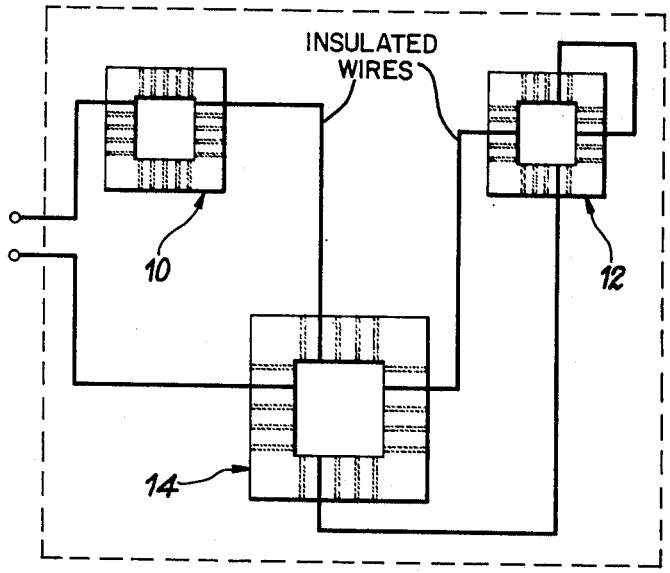

Next, the desired connecting circuit is manufactured as illustrated in FIGS. 3a and 3b. By way of illustration, the drawings show three frames 10, 12 and 14 adapted to receive three electronic components which have to be connected. The connecting circuit is made from an insulated wire 16 which connects the grooves of the different frames, depending on the desired connecting circuit. In one embodiment of the method, the complete connecting circuit should preferably be broken up into partial circuits made from a single length of wire, such as wire 16, which is conveyed into the appropriate grooves of the frame. A partial circuit of this kind is shown in FIG. 3a and comprises a single length of insulated wire, the ends of the wires being denoted by references $E_1$ and $S_1$. Other partial circuits, not shown in FIG. 3, are designed in the same manner and will be superposed on the first partial circuit.

AS FIG. 3a shows, the single length of wire 16 extends through the centre part of the frames. As a result, the conducting wire connecting pads for securing the connecting wire can be manufactured by a simple electrolytic process. In the last-mentioned embodiment, each partial circuit can be energised before the connecting wire has been cut, and an electrolytic deposit can be formed at the grooves through which the connecting wire extends, after the wire has been stripped at the corresponding places.

After the electrolytic operation for forming the metal wire connecting pads in which the different lengths of connecting wire are embedded, the central parts of the frames are cut out, for example by mechanical punching, giving a substrate as shown in FIG. 3b, which does not differ from the substrate in FIG. 3a except for the cut-out central parts of the frame.

Figure 4:
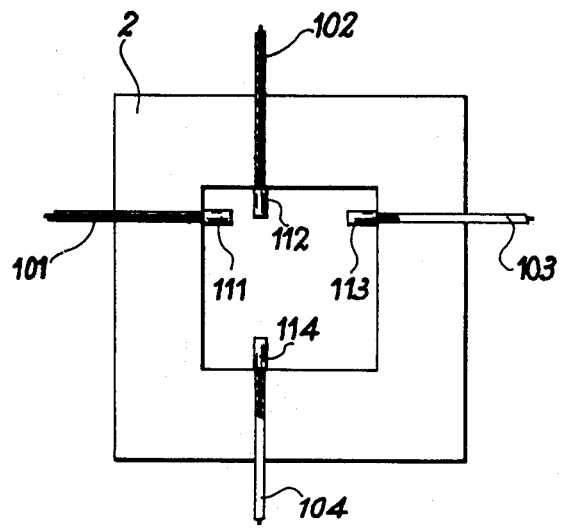
FIG. 4 shows an alternative form of conducting wire connecting pads.

Of course, instead of forming the wire connecting pads in grooves 4, they can project slightly inside the frame, as shown in FIG. 4. FIG. 4 shows a frame 2 and, by way of example, four connections 101, 102, 103 and 104 and four corresponding wire connecting pads 111, 112, 113 and 114. In this case, the connections are not cut level with the side walls in the central parts of the frames, as in FIG. 3b. Of course, the two embodiments in FIGS. 3 and 4 can also be combined.

If the last-mentioned method is used for manufacturing the connecting circuit, the circuit can be tested in a very simple manner by measuring the ohmic resistance of the length of wire used between the two ends, e.g. $E_1$ and $S_1$ for the partial circuit in FIG. 3a. These tests can be of the non-cut-off or short-circuit type.

Figure 5A:
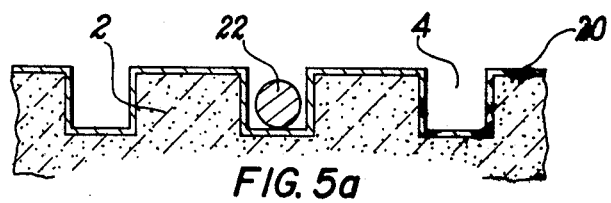
FIGS. 5a – 5c are highly magnified detail showing the grooves in the frames and the anchoring of the stripped wire in the conducting wire connecting pads.
Figure 5B:
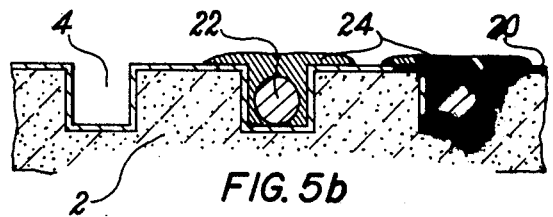
Figure 5C:
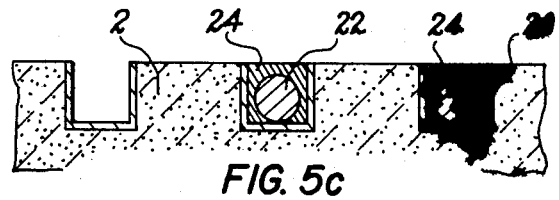

The method of connecting the wire to the frames will be more clearly understood from FIG. 5, which is a highly enlarged detail showing how the wire is anchored in the metal wire connecting pads of the frames. FIG. 5a is a cross-section of the insulating frame 2 in which grooves 4 have been formed. The support 2, or at least, the interior of grooves 4, is covered with a thin metal layer 20 which can be formed by chemical copper-plating. The connecting wire is stripped at the grooves 4 so as to expose the metal core 22. Stripping is e.g., by thermal volatilization or by chemical corrosion of a given length of insulating layer, using a solvent. Grooves 4 are filled by electrolytic copper-plating in a copper sulphate bath, e.g., using a soluble copper anode and the wire as cathode, so as to enclose the metal core in a wire connecting pad 24, as shown in FIG. 3b. The last operation consists in electrically insulating the different metal wire connecting pads 24 from one another, either by polishing or by chemical corrosion of the top surfaces of frames 2. The final state is shown in FIG. 5b.

By way of illustration, the grooves can have a width and height of about 50 microns, and the metal core of the insulated wire can have a diameter of a few tens of microns, e.g., 30 microns. Consequently, the junction between the metal core and the wire connecting pad is very adhesive, since the core is anchored in the mass. In prior art devices, welds are made on end layers about 1 micron thick, or on thick layers about 15 microns thick, with the result that the welds are less reliable and very difficult to repair.

In a preferred embodiment of the method, the insulated wire is secured to the support by thermo-adhesion. In this embodiment, the wire is positioned as illustrated in FIG. 6. In FIG. 6 an insulating support 30, which may be made of polyimide, is covered with a thermoset adhesive layer 32 on to which a feed head 34 presses an insulated connecting wire 36. The feed head contains a capillary tube 38 through which the insulated wire 36 travels, and a heating coil 40 for heating the thermoset adhesive wire. The capillary tube terminates in a curved zone 42 for guiding wire 36 irrespectively of the direction in which it unwinds. The feed head 34 is mounted in a holder (not shown) which exerts some pressure on the wire so as to push it into the thermoset adhesive layer 32.

According to a special feature, the feed head is stationary and the support 30 is secured to a table 44 which can move in a plane, and the movement of which may be controlled by an automatic programmed device. In this method, the connecting wires can be placed very closely to one another so as to form junctions, since thermoset adhesive wires have the property of sticking to one another. In FIG. 6, for example, a wire 36 covers a previously-deposited wire 46. Accordingly, the density of connections can be very high without taking special precautions of avoid short-circuit between wires.

Instead of thermoset adhesive wires, the wires used can be covered with a layer which has adhesive properties after passing through a suitable technical bath. Alternatively a single layer adhering to the wire or to the support may be quite sufficient.

After the insulated wire has been deposited on to the support 30 to form the desired connecting circuit and the wire has been connected to the conducting wire connecting pads, the resulting connecting substrate is ready to receive the various electronic micro-components for which it has been designed. The complete hybrid circuit can then be obtained, merely by placing the micro-components in position and connecting the different wire connecting pads at the output connections of the micro-components. The results of this operation, in the case of two embodiments, is shown in FIGS. 7 and 8. FIG. 7 is a cross-section of a frame 2 provided with metal wire connecting pads 25 and 25'; the frame is deposited on a support 30. The electronic micro-component 50 has output connections 52 and 54, which are welded to wire connecting pads 25 and 25' respectively. Advantageously the weld can be made on all the hybrid circuit connections simultaneously, using thermo-compression, ultrasonic or other means. FIG. 7 also shows connecting wires 36, 36' anchored in wire connecting pads 25, 25' respectively.

Advantageously frame 2 is the same height as the panel 50 of the electronic micro-components so that the entire inactive surface 56 of the panel 50 is in intimate contact with support 30, e.g., by soldering or welding. This results in very efficient evacuation of the heat liberated during operation by panel 50 and the assembly has very good mechanical properties. If the properties are unsatisfactory, the assembly can be deposited on a second rigid metal or insulating support 31.

The hybrid circuit according to the embodiment in FIG. 4 is diagrammatically represented in FIG. 8. Some elements in FIG. 8 are identical with those in FIG. 7 and bear the same reference numbers, e.g., the support 30, the frame 2, the electronic micro-component 50 and the connecting wires 36, 36'. In the last-mentioned embodiment, the wire connecting pads are in the form of fingers 120, 122 in contact with the corresponding connections 124, 126 of panels 50. Of course the panel should be introduced by the bottom into its frame, after cutting out the support 30 in the interior of the frame. The bottom part 52 of panel 50 can then be secured to a second support 31 which is rigid and may be an electrical conductor or insulator and which ensures good evacuation of heat and strengthens the hybrid circuit assembly.

The connecting substrate constructed by the method according to the invention and illustrated in FIGS. 3, 4 and 7 is particularly suitable for electronic micro-components having output connections of the kind called Beam-lead or mini-mod in the English-language literature. It is known that, in the aforementioned methods, the wire connecting pads connecting the panel bearing the electronic micro-component are prolonged by metal output micro-beams. The micro-beams can be constructed at the same time as the integrated circuit is manufactured (Beam-lead method) or by welding metal lugs etched in an insulating circuit (Mini-mod method). In both methods, the panel bearing the micro-component is deposited in the frame with its active surface upwards, so that the position and state of the welds is continuously visible.

The embodiments illustrated in FIGS. 1, 4 and 8 are more suitable for electronic micro-components having output connections of the kind called Flip-chip in the English-language literature. It is known that, in the last-mentioned method, connections are grown on the micro-component panel in the form of hemispherical protuberances, represented e.g., by connections 124 and 126 in FIG. 8. In the case of the connecting substrate in FIG. 1c, the panel will, of course, be disposed on the reverse side, so that the protuberances come into contact with the corresponding wire connecting pad 62.

Finally, the support 30 in FIGS. 6, 7 and 8 need not be insulating, since electrical insulation is provided by the insulated wire. On the contrary, it may advantageously be an electric conductor and act as an earth plane for the circuit. A metal, for example, will have the additional advantage of more effectively dissipating the heat produced in the micro-components.

As the description shows, the method of connecting according to the invention has many advantages, as follows:

Very simple methods of manufacture;
It is very easy to modify connections;
The density of connections can be very high;
An unlimited number of layers may be superposed;

There is no physical or mechanical discontinuity between any two points to be connected;

There is great liberty in the choice of the path of the connecting wires, since they can be in contact with one another;

The circuit can be electrically tested by measuring the ohmic resistance;

The connection can be programmed;

Integrated circuits can be mounted with their active surface facing upwards and their base stuck to the support; and The welds are highly reliable.

What we claim is:

1. A method of connecting electronic microcomponents comprising the steps of:

securing wire connecting pads on a support, the position of which is adapted to the arrangement of the connections for the microcomponents;

unwinding a continuous wire over said pads to form a circuit;

dividing said circuit into a plurality of partial circuits;

superposing said partial circuits to obtain the complete connecting circuit;

stripping the insulated wire at each pad;

securing the stripped wire portions to the corresponding pads;

cutting off those parts of the wire which do not form part of the final connecting circuit;

positioning the microcomponents so that each microcomponent is in electrical contact with one of said pads; and securing the microcomponents to their respective pads.

2. A method according to claim 1, wherein the connecting circuit is electrically tested by making a non-cut-off test on each of the partial connecting circuits when they are still in one piece.

3. A method of connecting electronic microcomponents comprising the steps of:

making insulating frames having dimensions such that each frame can receive one panel of microcomponents to be connected and forming grooves in the frame peripheries;

disposing the frames on a support, said grooves being parallel to said supprt;

placing a continuous wire into said grooves to form a circuit;

dividing said circuit into a plurality of partial circuits;

superposing the partial circuits relative to each other to obtain a complete connecting circuit;

stripping the wire at the places where wire connecting pads are to be positioned;

manufacturing the pads by forming an electrolytic deposit, during which the continuous wires forming each partial circuit are raised to appropriate potentials;

cutting off those parts of the wire not forming part of the final connecting circuit;

positioning the microcomponents so that each microcomponent is in electrical contact with one of said pads; and securing the microcomponents to their respective pads.

4. A method according to claim 3, comprising the steps of:

forming said pads in grooves in the frames;

subsequently cutting out the central parts of the frames flush with the inner side walls of the frames;

positioning said microcomponent panels by depositing them by the top in their respective frames.

5. A method according to claim 4 wherein the central parts are cut out by mechanical punching.

6. A method according to claim 3, wherein the connecting circuit is electrically tested by making a non-cut-off test on each of the partial connecting circuits when they are still in one piece.

7. A method according to claim 3, comprising the steps of:

forming the pads inside the frames;

subsequently cutting out the central parts of the frame leaving the pads at the inner edge of the side walls of the frames;

cutting out also the part of the support inside the frame;

positioning the microcomponent by inserting them by the bottom into their respective frames;

securing the panel bottoms to a second rigid support.

8. A method according to claim 7, wherein the central parts are cut out by mechanical punching.

* * * * *